United States Patent [19]

Cooley et al.

[11] Patent Number: 4,799,019
[45] Date of Patent: Jan. 17, 1989

[54] ELECTRICAL CONTINUITY LOAD MONITORING CIRCUIT

[76] Inventors: Charles Cooley, 8766 Timber Point, San Antonio, Tex. 78250; William Fenton, Jr., 70 Springwood Rd., South Portland, Me. 04106

[21] Appl. No.: 20,873

[22] Filed: Mar. 2, 1987

[51] Int. Cl.$^4$ ................... G08B 21/00; G01R 31/02
[52] U.S. Cl. ........................... 324/546; 324/133; 324/537; 324/555; 324/556; 340/652
[58] Field of Search .............. 324/546, 511, 537, 555, 324/556, 503, 133; 307/632; 361/100

[56] References Cited

U.S. PATENT DOCUMENTS

| | | | |
|---|---|---|---|
| 3,863,150 | 1/1975 | Cebuliak et al. ............ | 324/133 |
| 4,353,025 | 10/1982 | Dobkin ........................ | 307/632 |
| 4,520,417 | 5/1985 | Frank ........................... | 340/652 |

FOREIGN PATENT DOCUMENTS 2846134  5/1979  Fed. Rep. of Germany ...... 324/133

*Primary Examiner*—Reinhard J. Eisenzopf
*Assistant Examiner*—Anthony L. Miele
*Attorney, Agent, or Firm*—Daniel H. Kane, Jr.

[57] ABSTRACT

A load monitoring, indicating, and alarm system monitors electrical continuity through an AC electrical load coupled in a first electrical line with an electrical indicator such as an indicating lamp in a second electrical line coupled in parallel with the first electrical line. A first AC electronic switch such as a triac is coupled in series with the indicator in the second electrical line. The actuating gate of the first AC electronic switch is coupled to the first electrical line. The first AC electronic switch is therefore conducting and the indicator lamp on when there is electrical continuity through the load and power is being supplied to the load. A reactance control component is coupled in series with the load for adjusting the phase angle of gate current to voltage delivered to the gate terminal of the first AC electronic switch. The reactive component may be a second AC electronic switch coupled in series with the electrical load in the first electrical line. A resistor operatively couples the gate terminal of the second AC electronic switch to the second electrical line. A normally closed relay and alarm may be coupled in a third electrical line placed in parallel with the first and second electrical lines for providing an audible alarm or other alarm signal when power is being supplied to the load and there is failure of electrical continuity through the load.

16 Claims, 2 Drawing Sheets

ELECTRICAL CONTINUITY LOAD MONITORING CIRCUIT

TECHNICAL FIELD

This invention relates to a new load monitoring circuit for monitoring electrical continuity through the load. The invention has particular application for example in motor controllers for monitoring operation of a motor space heater when the motor is not running.

BACKGROUND ART

In commercial motor controllers for motors in the horsepower range of for example 10 to 200 horsepower, there is generally a circuit which turns on a motor space heater when the motor is not running. Such motor space heaters are necessary for preventing moisture condensation in motors used in outdoor, marine, and high humidity environments. Should the motor heater or motor space heater fail in such high moisture content environments, there is rapid deterioration of insulation resistance of the motor coils causing accelerated burn out of the motor.

Space heater failure is in fact one of the most common causes of motor burn out and loss in high humidity, outdoor and marine environments. Motor windings must be rewound with loss of operation time. In conventional motor controllers, the only indication of the operation of the motor space heater is a heater light wired in parallel with the motor heater. This conventional heater light only indicates that power is being supplied to the motor space heater coils and does not indicate failure of the heating coils or more generally failure of electrical continuity through the motor space heater load.

A conventional motor space heater subcircuit 10 of a standard motor controller is illustrated in FIG. 1. The motor space heater 12 receives power on lines 16 from a motor controller circuit, not shown, and the indicator lamp or light 14 is coupled in parallel with the motor heater 12. The parallel coupled space heater 12 and indicator lamp 14 are coupled in series with a normally closed relay 15 of the motor controller which is opened by a relay activator or armature of the motor controller when the motor is operating. Thus, no power is supplied to the motor space heater 12 and heater lamp 14 when the motor is operating When the motor turns off the relay 15 closes and power from the motor controller is supplied to the space heater 12 and indicator light 14 to prevent moisture condensation in the idle motor coils.

The disadvantage of this conventional arrangement is of course that the indicator lamp 14 is on as long as power is supplied from the motor controller to the motor space heater whether or not the motor space heater 12 is operating. There is no indication provided of failure of the motor heater or failure of electrical continuity through the motor heater coils.

OBJECTS OF THE INVENTION

It is therefore an object of the present invention to provide a new motor space heater monitor and indicator which monitors electrical continuity through the motor space heater coils and provides indication of motor heater failure.

More generally it is an object of the invention to provide an electrical continuity load monitoring circuit for monitoring electrical continuity through an AC electrical load and for providing indication of load failure.

Another object of the invention is to provide an AC load monitoring circuit with indicator light that operates when power is being supplied to the load with electrical continuity through the load, and an alarm that is actuated when power is being supplied to the load and there is failure of electrical continuity through the load.

DISCLOSURE OF THE INVENTION

In order to accomplish these results, the present invention provides an improved electrical continuity load monitoring circuit for monitoring an AC electrical load coupled in a first electrical line with an electrical indicator such as an indicating lamp in a second electrical line coupled in parallel with the first electrical line. According to the invention a first AC electronic switch is coupled with first and second electrode terminals in series with the indicator in the second electrical line. The AC electronic switch includes an actuating gate and gate terminal coupled to the first electrical line for delivering gate current and voltage to the first AC electronic switch.

A feature and advantage of this arrangement is that the first AC electronic switch is conducting through the first and second electrode terminals in series with the indicator when there is electrical continuity through the load and power is being supplied to the load and indicator. The indicator is therefore actuated. For example an indicating lamp is lit in the second electrical line for indicating that power is being supplied to the load with electrical continuity through the load.

The invention also provides a reactance component or reactance control component in series with the load in the first electrical line for adjusting the phase angle of gate current to voltage delivered to the gate of the first AC electronic switch. A feature and advantage of this arrangement is that because the AC electronic switch is sensitive to phase angle, the phase angle of gate current to voltage may be controlled and adjusted to increase and maximize turn on and conductance through the first and second electrodes of the AC electronic switch.

In the preferred example embodiment, the reactive component in the first electrical line is a second AC electronic switch with first and second electrode terminals coupled in series with the electrical load. A resistor operatively couples the gate terminal of the second AC electronic switch to the second electrical line. As a result the second AC electronic switch is conducting through the first and second electrode terminals in series with the load when power is supplied to the load and indicating means with the first AC electronic switch also conducting. The second AC electronic switch functions as a reactive element adjusting the phase angle of current to voltage in the first electrical line.

The first and second AC electronic switches in the preferred example are first and second triacs in a reciprocal, back to back, or complementary coupling in the first and second electrical lines. That is, the gate terminal of the first triac is coupled to the first electrode terminal of the second triac in the first electrical line. On the other hand the gate terminal of the second triac is coupled to the first electrode terminal of the first triac in the second electrical line through the resistor. A feature and advantage of this reciprocal, complementary, or back to back coupling relationship is that the first triac is conducting through its first and second electrode terminals in series with the indicating means when there is electrical continuity through the load and power is being supplied to the load. The second triac is similarly conducting with its first and second electrode terminals in series with the load when power is being supplied to the monitored load and indicator and there is electrical continuity though the load. As a result the indicator light is always on when power is supplied and the load is operating.

According to another embodiment of the invention, the electrical load monitoring circuit includes a third electrical line coupled in parallel with the second electrical line and first electrical line. Normally closed relay contacts and an alarm such as an audible alarm or other alarm signaling device are coupled in series in the third electrical line. A relay armature or actuator for actuating the normally closed relay contacts is coupled in series with the first AC electronic switch in the second electrical line. The normally closed relay in the third electrical line is opened when power is supplied to the electrical load and indicator and there is electrical continuity through the load so that the alarm cannot operate. The normally closed relay closes actuating the audible alarm or other alarm signaling device when power is being supplied to the load and the load fails or there is failure of electrical continuity through the load.

A feature and advantage of this co-acting monitoring, indicating, and alarm circuit is that the indicator lamp or other indicator provides continuous indication whenever the load is operating, and power is being supplied to the load. Should there be load failure, for example failure of electrical continuity through a motor heater coil, or failure of another electrical component of the load monitoring circuit, an alarm sounds or other alarm signal as provided. An alarm signal may also be provided to a remote location. Other objects, features and advantages of the invention are apparent in the following specification and accompanying drawings.

DESCRIPTION OF PREFERRED EXAMPLE EMBODIMENTS AND BEST MODE OF THE INVENTION

Figure 1:
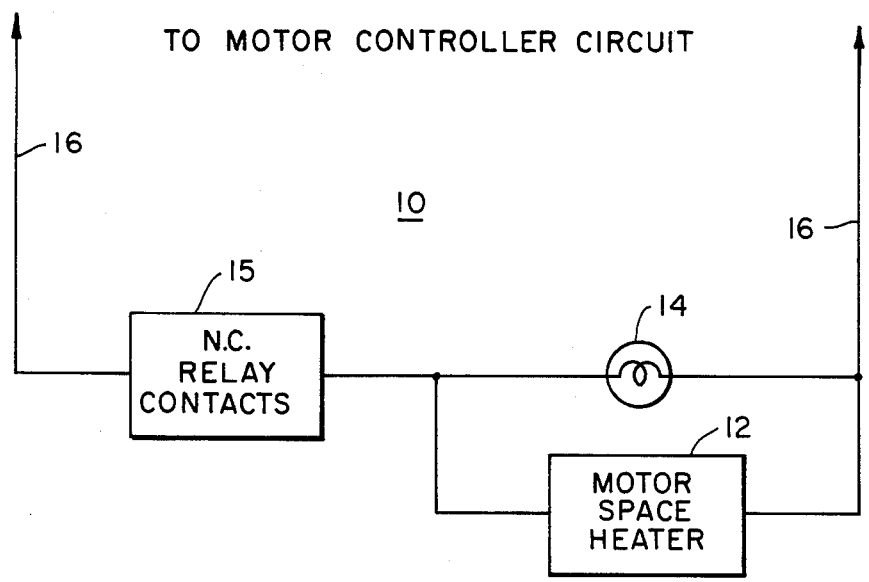
FIG. 1 is a schematic circuit diagram of the motor heater subcircuit of a conventional motor controller circuit.
Figure 2:
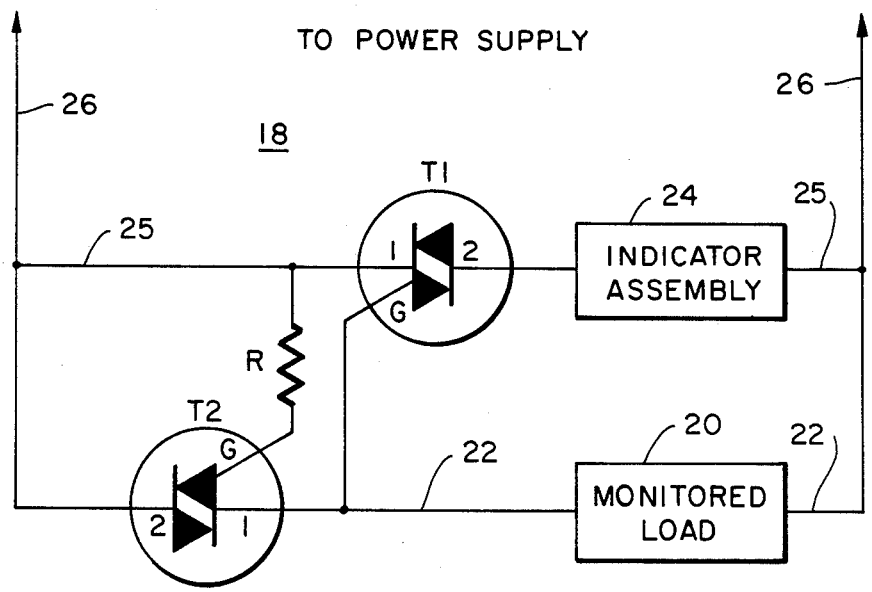
FIG. 2 is a schematic circuit diagram of an electrical continuity load monitoring and indicating circuit according to the present invention.

In the load monitoring and indicating circuit 18 according to the present invention indicated in FIG. 2 the load 20, for example a motor space heater to be monitored, is coupled in a first electrical line 22 while an indicator assembly 24 such as an indicator lamp or light is coupled in a second electrical line 25 in parallel with the first electrical line 22. A first AC electronic switch, triac T1, is coupled in the second electrical line 25 with first and second electrode terminals 1 and 2 coupled in series with the indicator assembly 24. The electrode terminals are designated by the terminal or pin numbers 1 and 2 in the schematic diagram of triac T1. The gate terminal or electrode G is coupled to the first electrical line 22. The first triac T1is conducting only when there is electrical continuity through the monitored load 20 and power is being supplied on lines 26 to the monitored load and indicator. Lines 26 may be coupled for example to a motor controller circuit where the monitored load 20 is a motor space heater.

When AC power is supplied with electrical continuity through monitored load 20, the gate current through gate terminal G of triac T1 drives triac T1 so that it is conducting through electrode terminals 1 and 2 and the indicator assembly 24, for example an indicator lamp, is operating. The "turn on" of triac T1 and the level of conduction through electrode terminals 1 and 2 is sensitive to the phase angle of gate current and voltage. According to the invention, a reactance element is included in the first electrical line 22 for adjusting the phase angle of current to voltage at gate terminal G to increase or maximize "turn on" of triac T1 according to the specifications for T1. Triac T1 may be for example a Radio Shack 276-1000 Triac rated at 400 volts. By providing a control reactance as hereafter described, operation of the monitoring circuit is independent of the reactance for example of the indicating assembly 24 and the load 20.

As shown in FIG. 2 the reactance control element is a second AC electronic switch, triac T2, coupled in the first electrical line 22 with electrode terminals 1 and 2 in series with the monitored load 20. The gate electrode terminal G of triac T2 is coupled through resistor R to the second electrical line 25. The triac T2 may be for example a Radio Shack 276-1001 Triac rated at 200 volts. Resistor R is typically for example 4.7K ohms. As long as current is conducting through the second electrical line 25 triac T2 is actuated by gate current and voltage so that it is conducting through electrode terminals 1 and 2 in series with the monitored load 20. Current is conducting through the second electrical line 25 as long as power is supplied to the load 20 with electrical continuity through the load causing triac T1 to conduct.

The triac T2 provides independent control of reactance in the first electrical line 22 adjusting the phase angle of gate current to voltage for full operation of triac T1. A feature and advantage of the reciprocal, complementary, or back to back coupling of the triacs T1 and T2 in electrical lines 25 and 22 is that the operation of the load monitoring and indicating circuit of FIG. 2 is independent of the reactance of either the monitored load 20 or the indicator assembly 24. Without the second AC electronic switch, triac T2, the resistance of the monitored load 20 would have to be approximately the same as or of the same order as the resistance R in order to work with the single triac T1.

With the complementary and reciprocal coupling of the dual AC electronic switches, triacs T1 and T2, in electrical lines 25 and 22, the indicating assembly 24 can have a high reactance. For example, a step down transformer may be used for stepping down voltage from 110 to, for example, 6 volts for operation of a 6 volt lamp or other low voltage indicator. Triac T1 in series with the indicator 24 is turned on independently from the indicator assembly by gate current passing through the monitored load 20. Furthermore, triac T1 is turned on to full conduction by the reactance across the second triac T2 in the first electrical line 22. Thus, the reactance across electrode terminals 1 and 2 of triac T2 gives the phase angle of gate current to voltage at the gate terminal G of triac T1 for substantially full turn on or conduction through triac T1.

If the continuity through the monitored load fails then the first AC electronic switch triac T1 is deprived of gate current and turns off to the non-conducting state. The indicator lamp or other indicator assembly 24 which may include for example a relay or any other indicating device, is shut off giving notice that the monitored load 20 is not operating. Similarly if any other component of the load monitoring circuit fails the indicating assembly is deactivated providing notice of some type of failure.

Figure 3:
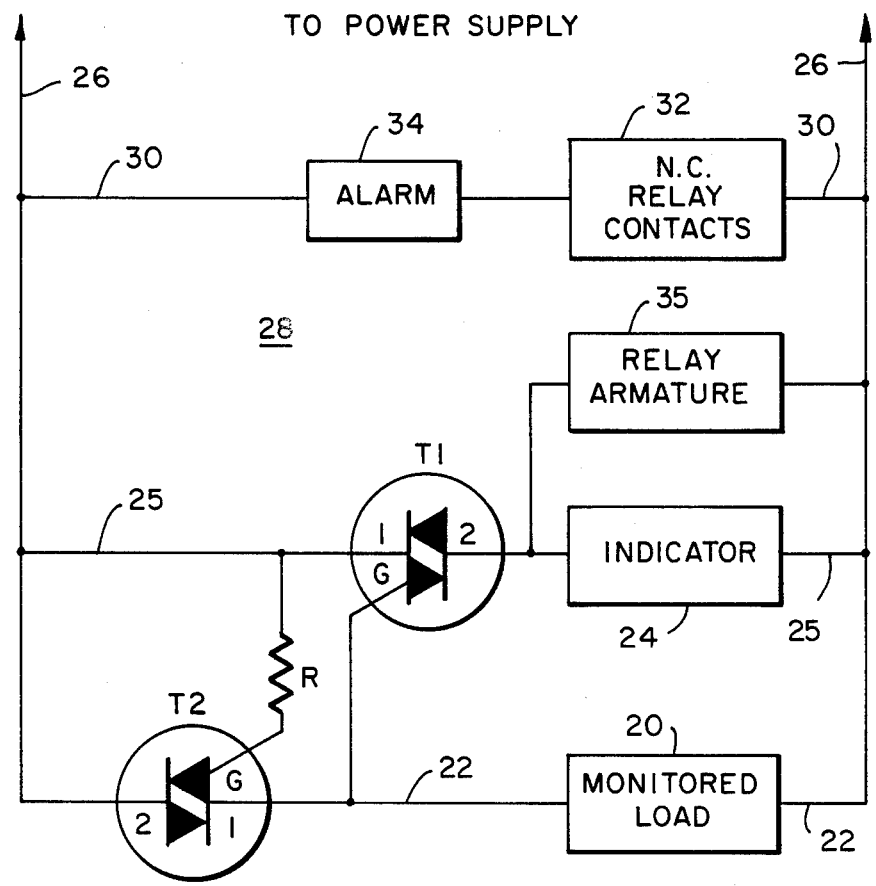
FIG. 3 is a schematic circuit diagram of an electrical continuity load monitoring, indicating and alarm circuit according to the invention.

While the reactance control element in the load monitoring circuits of FIGS. 2 and 3 is a second AC electronic switch, namely triac T2, other reactance components may also be used. For example a reactance network may be used instead of the AC electronic switch, replacing triac T2 in the first electrical line 22. Such a reactance network is composed of inductance elements or coils and capacitors with component values of inductance and capacitance selected to achieve the desired reactance and phase angle of gate current to voltage in the first electrical line 22 required for proper gating according to the specifications of triac T1.

lighted the relay contacts 32 are open and the alarm 34 cannot operate. In the event of failure of the load 20 or failure of electrical continuity through the load the indicator light 24 turns off and at the same time relay contacts 32 close. Because power is still being supplied on lines 26 the alarm 34 is sounded. A summary of the different operational conditions of the generalized electrical continuity load monitoring, indicating, and alarm circuit 28 is provided in TABLE I, while TABLE II summarizes the operational conditions of the circuit 28 applied in a motor heater monitoring circuit.

TABLE I

Load Monitoring Circuit Operational Conditions

| | Power Supply to Load and Indicator | Power Failure | Electrical Continuity Thru Load | Failure of Electrical Continuity Thru Load | Indicator Light | Alarm Signal |
|---|---|---|---|---|---|---|
| 1 | On | No | Yes | No | On | Off |
| 2 | Off | No | Yes | No | Off | Off |
| 3 | On | No | No | Yes | Off | On |
| 4 | Off | Yes | Yes | No | Off | Off |

TABLE II

Motor Heater Monitoring Circuit Operational Conditions

| | Motor | Power Supply to Motor Heater | Motor Heater (Load) | Electrical Continuity Thru Motor Heater | Failure of Electrical Continuity | Motor Heater Indicator Light | Alarm Signal |
|---|---|---|---|---|---|---|---|
| 1 | Off | On | On | Yes | No | On | Off |
| 2 | On | Off | Off | Yes | No | Off | Off |
| 3 | Off | On | Off | No | Yes | Off | On |
| 4 | Off | Off | Off | Yes | No | Off | Off |

A further embodiment of the invention for a load monitoring, indicating and alarm circuit 28 is illustrated in the schematic diagram of FIG. 3. In this circuit diagram the circuit elements in common with FIG. 2 are indicated by the same reference numerals. In addition there is provided a third electrical line 30 in parallel with the first electrical line 22 and second electrical line 25 with normally closed relay contacts 32 and an alarm 34 such as an audible alarm or other alarm signaling device coupled in series in the third electrical line 30. The relay contacts 32 are normally closed and are actuated and opened by a relay armature or actuator 35 coupled in series with the first AC electronic switch triac T1 in the second electrical line 25. In the example of FIG. 3 the relay armature 35 is coupled in parallel with the indicator 24 in the second electrical line 25.

When power is supplied to the monitored load 20 on lines 26 the relay armature 35 actuates the relay contacts 32 opening the contacts so that the alarm 34 cannot operate. In the event of failure of the load 20 or failure of electrical continuity through the load the first triac T1 loses its gate current and becomes nonconducting so that the indicator lamp 24 and relay armature 35 are deactivated. As a result the normally closed relay contacts 32 close and the power supplied on lines 26 sounds the alarm 34 indicating failure of the load. The alarm 34 may be for example a sound alarm or other alarm signaling device or a remote signaling device for example for signaling a remote location using a relay or other remote signaling arrangement.

The advantage of the load monitoring circuit of FIG. 3 is that a constant indication is provided by indicator 24 such as the light or indicator lamp so long as power is being supplied to the monitored load 20 with electrical continuity through the load. As long as power is supplied through the load 20 and indicator lamp 24 is Because the AC electronic switches are running fully on or fully off there is very little radio frequency (RF) interference. In circumstances where even slight RF interference cannot be tolerated, an RF interference filter can be incorporated in the load monitoring circuit. For example an RF inductance choke coil such as a 100 micro-henry coil may be coupled in series with the load monitoring circuit in line 26 with a 0.1 microfarad capacitor coupled in parallel across the lines 26.

During operation of the load monitoring circuit a small voltage drop occurs across the triacs T1 and T2 which represents a very small but continuous loss of power. The circuit may operate at line voltage or at any voltage for which the triacs T1 and T2 are rated. The direct gate connection of triac T1 with the first electrical line 22 may cause triac T1 to heat slightly. For these applications, it may be useful to couple a heat sink to triac T1. For this purpose, the metal surface packaging of the triac may act as the heat sink. Alternatively a triac with a voltage rating two to three times the circuit voltage may be used to avoid any evidence of heat build up. Thus, at line voltage operation, triac T1 is selected with rating for example of 400 volts while triac T2 is rated for operation at up to 200 volts.

The electrical continuity load monitoring circuit has a wide range of applications. The circuit is useful for monitoring any electrical load for which failure and outage cannot be tolerated or cannot be tolerated for any substantial period of time. Such electrical loads include for example security lights, alarm systems, industrial processes, essential heating circuits, commercial refrigerating and cooling equipment. While the invention has been described with reference to its application in monitoring motor space heaters, it may be applied usefully and inexpensively in these and a variety of other applications as a load monitoring and indicating circuit or as a load monitoring, indicating and alarm circuit.

We claim:

1. An improved electrical continuity load monitoring circuit for monitoring an AC electrical load coupled in a first electrical line including electrical indicating means in a second electrical line coupled in parallel with the first electrical line and load for monitoring the load comprising:

first AC electronic switch means comprising first and second electrode terminals coupled in series with the indicating means in the second electrical line, said first AC electronic switch means also comprising a gate terminal coupled to the first electrical line for delivering gate current and voltage to the first AC electronic switch means so that the first AC electronic switch means is conducting through the first and second electrode terminals in series with the indicating means when there is electrical continuity through the load and power is being supplied to the load and indicating means thereby actuating the indicator means in the second electrical line for indicating that power is supplied to the load with electrical continuity through the load;

reactance control means coupled in series with the load in the first electrical line for adjusting the phase angle of gate current to voltage delivered to the first electronic switch means for turn on of the first electronic switch means said reactance control means comprising a second AC electronic switch means having first and second electrode terminals coupled in series with the electrical load in the first electrical line and a gate terminal, resistance means operatively coupling the gate terminal to the second electrical line so that the second AC electronic switch means is conducting through the first and second electrode terminals in series with the load when power is being supplied to the load and indicating means and the first electronic switch means is conducting.

2. The load monitoring circuit of claim 1 wherein the first AC electronic switch means comprises a first triac.

3. The load monitoring circuit of claim 1 wherein the first and second AC electronic switch means comprise first and second triacs.

4. The load monitoring circuit of claim 3 wherein the first AC electronic switch means comprises a first triac, the gate terminal of the first triac being coupled to the first electrode terminal of the second triac and the gate terminal of the second triac being coupled to the first electrode terminal of the first triac through said resistance means.

5. The load monitoring circuit of claim 4 wherein the second electrode terminal of the first triac is coupled to the indicating means in the second electrical line and the first electrode terminal of the second triac is coupled to the load in the first electrical line, the first electrode terminal of the first triac being coupled to the second electrode terminal of the second triac for the parallel coupling between the first and second electrical lines.

6. The load monitoring circuit of claim 1 wherein the indicating means comprises resistance light means.

7. An improved electrical continuity load monitoring circuit for monitoring an AC electrical load coupled in a first electrical line including electrical indicating means in a second electrical line coupled in parallel with the first electrical line and load for monitoring the load comprising:

first AC electronic switch means comprising first and second electrode terminals coupled in series with the indicating means in the second electrical line, said first AC electronic switch means also comprising a gate terminal coupled to the first electrical line for delivering gate current and voltage to the first AC electronic switch means so that the first AC electronic switch means is conducting through the first and second electrode terminals in series with the indicating means when there is electrical continuity through the load and power is being supplied to the load and indicating means thereby actuating the indicator means in the second electrical line for indicating that power is supplied to the load with electrical continuity through the load;

reactance control means coupled in series with the load in the first electrical line for adjusting the phase angle of gate current to voltage delivered to the first electronic switch means for turn on of the first normally closed relay contact means and alarm signal means coupled in series in a third electrical line, said third electrical line and series coupled normally closed relay contact means and alarm signal means being coupled in parallel with the second electrical line and series coupled first AC electronic switch means and indicator means;

and relay armature actuating means for actuating said normally closed relay contact means said relay armature actuating means being coupled in series with the first AC electronic switch means in the second electrical line so that the normally closed relay in the third electrical line is open when power is supplied to the electrical load and indicating means and there is electrical continuity through the load and so that the normally closed relay closes actuating the alarm signal means when there is power being supplied to the load and there is failure of electrical continuity through the load.

8. An improved electrical continuity load monitoring circuit for monitoring an AC electrical load coupled in a first electrical line including electrical indicating means in a second electrical line coupled in parallel with the first electrical line and load for monitoring the load comprising:

first AC electronic switch means comprising first and second electrode terminals coupled in series with the indicating means in the second electrical line, said first AC electronic switch means also comprising a gate terminal coupled to the first electrical line for delivering gate current and voltage to the first AC electronic switch means so that the first AC electronic switch means is conducting through the first and second electrode terminals in series with the indicating means when there is electrical continuity through the load and power is being supplied to the load and indicating means thereby actuating the indicator means in the second electrical line for indicating that power is supplied to the load with electrical continuity through the load;

second AC electronic switch means having first and second electrode terminals coupled in series with the electrical load in the first electrical line and a gate terminal, resistance means operatively coupling the gate terminal to the second electrical line so that the second AC electronic switch means is conducting through the first and second electrode terminals in series with the load when power is being applied to the load and indicating means and the first electronic switch means is conducting, said second AC electronic switch means adjusting the phase angle of current to voltage in the first electrical line for turn on of the first AC electronic switch means: and said first and second AC electronic switch means being coupled with the gate terminal of the first AC electronic switch means coupled to the first electrode terminal of the second AC electronic switch means in the first electrical line and the gate terminal of the second AC electronic switch means coupled through said resistance means to the first electrode terminal of the first AC electronic switch means in the second electrical line.

9. The load monitoring circuit of claim 8 wherein the second electrode terminal of the first AC electronic switch means is coupled to the indicating means in the second electrical line and the first electrode terminal of the second AC electronic switch means is coupled to the load in the first electrical line, the first electrode terminal of the first AC electronic switch means being coupled to the second electrode terminal of the second AC electronic switch means for the parallel coupling between the first and second electrical lines.

10. The load monitoring circuit of claim 9 wherein the first and second AC electronic switches comprise first and second triacs.

11. The load monitoring circuit of claim 8 wherein the indicator means comprises a resistance light means.

12. The load monitoring circuit of claim 8 further comprising normally closed relay contact means coupled in series with alarm signal means in a third electrical line, said third electrical line and series coupled normally closed relay contact means and alarm signal means being coupled in parallel with the second electrical line and series coupled first AC electronic switch means and indicator means.

13. The load monitoring circuit of claim 12 further comprising relay armature actuating means for actuating said normally closed relay contact means said relay armature actuating means being coupled in series with the first AC electronic switch means in the second electrical line so that the normally closed relay in the third electrical line is opened when power is supplied to the electrical load and indicating means and there is electrical continuity through the load and so that the normally closed relay closes actuating the alarm signal means when there is power being supplied to the load and there is failure of electrical continuity through the load.

14. The load monitoring circuit of claim 13 wherein the indicator means comprises a resistance light means and the alarm means comprises a sound alarm.

15. The load monitoring circuit of claim 13 wherein the relay armature actuating means is coupled in parallel with the indicating means in the second electrical line.

16. The load monitoring circuit of claim 13 wherein the first and second AC electronic switch means comprise first and second triacs.

* * * * *